United States Patent
Eshima et al.

(10) Patent No.: US 7,411,277 B2
(45) Date of Patent: Aug. 12, 2008

(54) SEMICONDUCTOR INTEGRATED CIRCUIT HAVING SHIELD WIRING

(75) Inventors: Takashi Eshima, Kawasaki (JP); Shogo Tajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 46 days.

(21) Appl. No.: 10/388,448

(22) Filed: Mar. 17, 2003

(65) Prior Publication Data

US 2003/0178706 A1   Sep. 25, 2003

(30) Foreign Application Priority Data

Mar. 19, 2002   (JP) .............................. 2002-075483

(51) Int. Cl.
*H01L 23/552*   (2006.01)
(52) U.S. Cl. ................. 257/659; 257/662; 257/E27.105
(58) Field of Classification Search ................. 257/659, 257/662, 508
See application file for complete search history.

(56) References Cited

U.S. PATENT DOCUMENTS

| | | | |
|---|---|---|---|
| 5,050,238 A * | 9/1991 | Tomizuka et al. ........... 455/300 |
| 5,111,274 A | 5/1992 | Tomizuka et al. |
| 5,185,650 A * | 2/1993 | Wakimoto et al. .......... 257/508 |
| 5,428,242 A * | 6/1995 | Furuya et al. ............... 257/538 |
| 5,825,080 A * | 10/1998 | Imaoka et al. .............. 257/659 |
| 5,886,371 A * | 3/1999 | Shinagawa .................. 257/207 |
| 6,166,403 A * | 12/2000 | Castagnetti et al. ......... 257/211 |
| 2003/0020098 A1 * | 1/2003 | Sasaki ......................... 257/210 |

FOREIGN PATENT DOCUMENTS

| | | |
|---|---|---|
| EP | 0 791 963 A1 | 8/1997 |
| EP | 0 917 202 A1 * | 5/1999 |
| JP | 02-51272 | 2/1990 |
| JP | 02-051272 A | 2/1990 |
| JP | 4-239154 | 8/1992 |
| JP | 6-318597 | 11/1994 |
| JP | 9-232547 | 9/1997 |

OTHER PUBLICATIONS

Search Report dated Dec. 10, 2003.
Japanese Office Action dated Aug. 8, 2006 (mailing date), issued in corresponding Japanese Patent Application No. 2002-075483.
Japanese Office Action dated Aug. 7, 2007, issued in corresponding Japanese Application No. 2002-075483.

* cited by examiner

*Primary Examiner*—Phat X Cao
(74) *Attorney, Agent, or Firm*—Westerman, Hattori, Daniels & Adrian, LLP.

(57) ABSTRACT

A shield wiring is provided on a boundary of a target region to be shielded of macros, an inner side of the boundary, an outer side of the boundary, or an inner side and an outer side of the boundary, each being as a black box, so as to surround the target region. This shield wiring is electrically connected to a power supply terminal or a power supply wiring of the macros or the like, or to a power supply wiring on another wiring layer through a contact section, thereby fixing a potential of the shield wiring. An accurate delay value is then obtained by estimating an influence of crosstalk between a wiring in a region where the physical wiring pattern is clear and the shield wiring and also estimating a capacitance produced between the wirings.

6 Claims, 4 Drawing Sheets

SEMICONDUCTOR INTEGRATED CIRCUIT HAVING SHIELD WIRING

CROSS-REFERENCE TO RELATED APPLICATIONS

This application is based upon and claims the benefit of priority from the prior Japanese Patent Application No. 2002-075483, filed on Mar. 19, 2002, the entire contents of which are incorporated herein by reference.

BACKGROUND OF THE INVENTION

1) Field of the Invention

The present invention relates to a semiconductor integrated circuit, and more particularly to a shield structure for a semiconductor integrated circuit in which macros as functional blocks or hierarchical blocks provided by hierarchical layout (which are referred to as "macro or the like" hereinafter) are surrounded by a shield wiring.

2) Description of the Related Art

In the design phase of a semiconductor integrated circuit, it is necessary to obtain delay values of wirings and gates so as to execute a delay simulation. To do so, it is necessary to estimate the influence of crosstalk and capacitances produced between the wirings, from the distance between the wirings. When the influence of crosstalk and that of the capacitances produced between specific wirings and the other wirings are eliminated and the capacitances between the wirings are accurately estimated, a shield wiring is provided along the specific wirings. In addition, by providing a shield layer on the macros or the like, it is possible to provide wirings outside of the macros or the like on a layer above the shield layer without considering the influence of crosstalk between the wirings inside and outside of the macros or the like and the capacitances produced between the wirings.

Generally, in the design of a semiconductor integrated circuit, a region in which wirings are arranged is divided into a plurality of regions, and the layout of the region inside of macros or the like and the layout of the region outside of the macros or the like are separately conducted. If the inside region of the macros is remarked and the influence of crosstalk and the capacitances produced between the wirings are to be estimated, and if the physical wiring pattern of the outside region of the macros or the like is unclear, then the outside region thereof is treated as a region in which the physical wiring pattern is not considered or so-called "a black box". In addition, if the outside region of the macros is remarked and the physical wiring pattern of the inside region of the macros is unclear, then the inside region of the macros is similarly treated as "a black box".

However, there is a case where because the physical wiring pattern of the black box is unclear, any region in which the physical wiring pattern is clear is remarked to estimate the influence of crosstalk and the capacitances produced between the wirings. In this case, if a black box exists near the remarked region when the estimation is carried out, then it is disadvantageously impossible to accurately estimate the influence of crosstalk undergone by the black box over the remarked region and the capacitances produced between the wirings.

SUMMARY OF THE INVENTION

It is an object of the present invention to provide a semiconductor integrated circuit having a shield structure capable of accurately obtaining a delay value with respect to a wiring in a region in which a physical wiring pattern is clear, without considering the influence of crosstalk undergone from a black box and capacitances produced between wirings when an inside region or an outside region of macros or the like is treated as the black box in which the physical wiring pattern is unclear.

According to the present invention, a shield wiring is provided on a boundary of the target region of a macro or the like, an inner side of the boundary, an outer side of the boundary, or an inner side and an outer side of the boundary so as to surround a target region to be shielded. This shield wiring is electrically connected to a power supply terminal or a power supply wiring of the macro or the like, or to a power supply wiring or the like of another wiring layer through a contact section.

According to this invention, even if the inside region of the macros or the like is a black box, it is possible to obtain an accurate delay value by estimating the influence of crosstalk between a wiring in the outside region of the macro or the like and the shield wiring and the capacitances produced between the wirings. Likewise, an accurate delay value is obtained when the outside region of the macro or the like is regarded as the black box and the influence of the crosstalk and the capacitances produced between the wirings are estimated for the wirings in the inside region of the macro or the like and a delay value is obtained based on the estimate.

These and other objects, features and advantages of the present invention are specifically set forth in or will become apparent from the following detailed descriptions of the invention when read in conjunction with the accompanying drawings.

DETAILED DESCRIPTION

An embodiment of the present invention will be explained in detail below with reference to the drawings. The shield structure in the embodiment is a layout structure in which a shield wiring is provided on a wiring layer around a black box if an inside region or outside region of macros or the like is treated as a black box in which a physical wiring pattern is unclear and is determined as a shield target region. FIGS. 1 to 4 show concrete examples of a plane layout structure, and FIG. 5 shows one example of a longitudinal cross-sectional structure when wiring layers of these plane layout structures are laminated.

Figure 1:
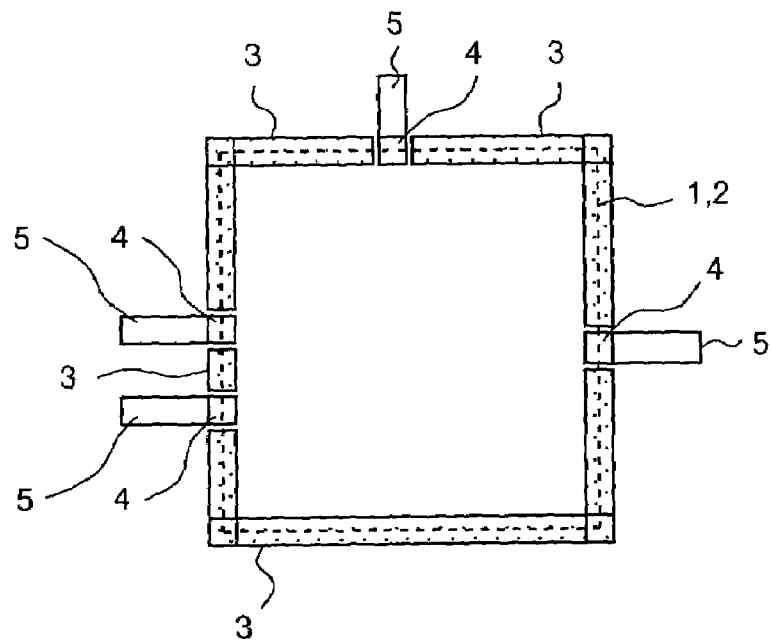
FIG. 1 is a plan view showing a first layout example of the shield structure for a semiconductor integrated circuit according to the present invention.

FIG. 1 is a plan view showing a layout structure in which a shield wiring is arranged on the boundary of a black box as a first example. In FIG. 1, a rectangular inside region indicated by a broken line of reference symbol 1 is a black box which consists of macros or the like 2. A shied wiring 3 is provided on the boundary of the black box 1 indicated by the broken line so as to surround the inside region of the black box 1.

External connection terminals 4 electrically connected to the inside of the macros or the like 2 are provided near the external periphery of the macros or the like 2, and wirings 5 are connected to the respective external connection terminals 4. The wirings 5 are electrically connected to a circuit or the like, not shown, outside the macros or the like 2. Each of the external connection terminals 4 includes a power supply terminal, which supplies a power supply voltage to the macros or the like 2 from the outside, and a signal terminal which transmits and receives signals between the macros or the like 2 and the external circuit.

The shield wirings 3 are connected to the power supply terminals. If the external connection terminals 4 are not the power supply terminals, the shield wiring 3 is broken off at the external connection terminals 4 and insulated from the external connection terminals 4 and the wirings 5. In the example shown in FIG. 1, the four external connection terminals 4 are not power supply terminals. Therefore, the shield wiring 3 is insulated from the external connection terminals 4. In addition, the shield wiring 3 is electrically connected to a power supply terminal, not shown, or a power supply wiring connected to the power supply terminal. Although the width of the shield wiring 3 is not specifically limited, it maybe, for example, a minimum width with which the wiring can be defined.

Figure 2:
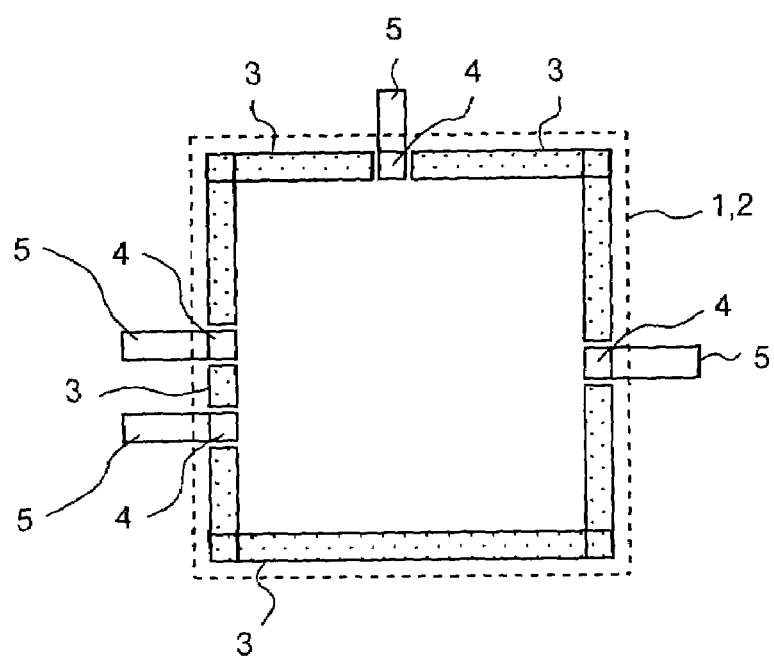
FIG. 2 is a plan view showing a second layout example of the shield structure.

FIG. 2 is a plan view showing a layout structure in which a shield wiring is arranged inside the boundary of the black box as a second example. In the second example similarly, the black box 1 is macros or the like 2 in a rectangular inside region indicated by a broken line. The shield wiring 3 is electrically connected to a power supply terminal, not shown, or a power supply wiring connected to the power supply terminal. In addition, the shield wiring 3 is broken off at the external wirings 4 which are not power supply terminals and insulated from the external power supply terminals 4 and wirings 5.

Figure 3:
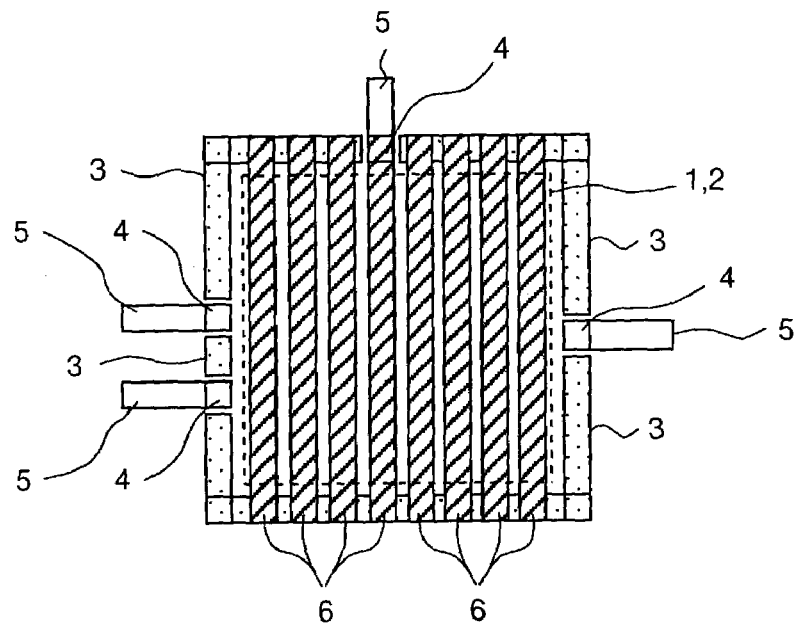
FIG. 3 is a plan view showing a-third layout example of the shield structure.

FIG. 3 is a plan view showing a layout structure in which a shield wiring is arranged outside the boundary of the black box as a third example. In the third example similarly, the black box 1 is macros or the like 2 in a rectangular inside region indicated by a broken line. A shield wiring 3 is broken off at external wirings 4 which are not power supply terminals and electrically connected to a power supply terminal, not shown, or a power supply wiring connected to the power supply terminal.

In the third example, the black box 1 is covered with, for example, stripe-like shield wirings 6 formed on a wiring layer above the shield wiring 3. The shield wirings 6 covering this black box 1 are connected only to wirings or terminals of specific potentials. The shield wirings 6 covering the black box 1 are connected to, for example, a power supply. By doing so, it is unnecessary to consider the influence of crosstalk undergone from wirings in the black box 1 or capacitances produced between the wirings with respect to all wirings in a region in which the physical wiring pattern is clear.

Figure 4:
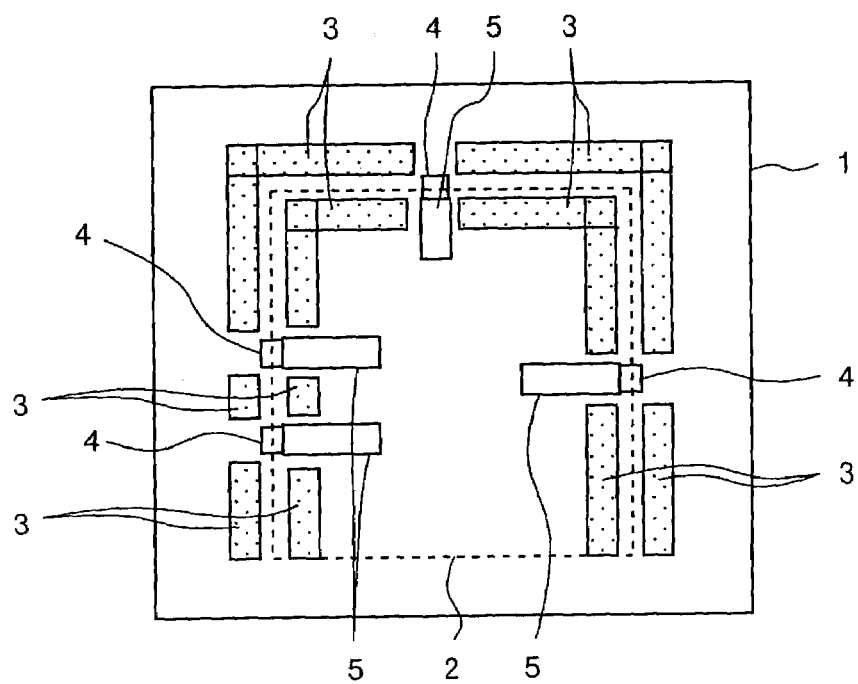
FIG. 4 is a plan view showing a fourth layout example of the shield structure.
Figure 5:
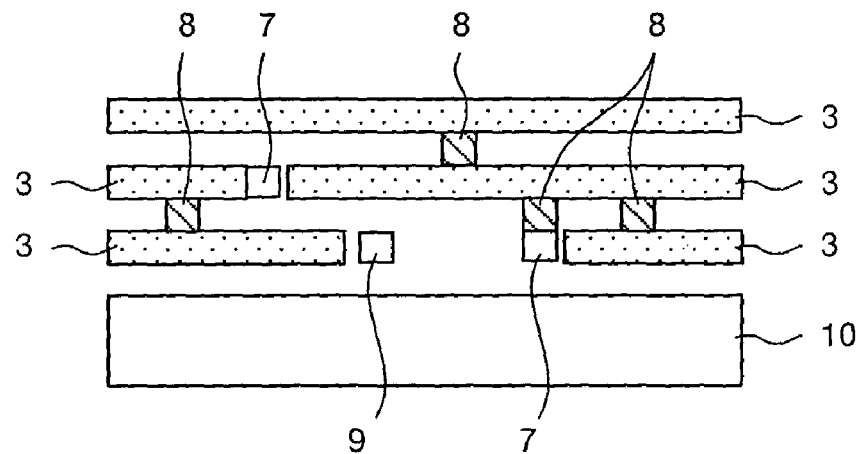
FIG. 5 is a cross-sectional view showing one example of a longitudinal cross-sectional structure when wiring layers of the plane layout structures as shown in FIGS. 1 to 4 are laminated.

FIG. 4 is a plan view showing a layout structure in which shield wirings are arranged inside and outside of the boundary of the blackbox, respectively, as a fourth example. In the fourth example, macros or the like 2 are a rectangular inside region indicated by a broken line and the black box 1 is the outside region of the macros or the like 2. In this case, therefore, the external connection terminals 4 which are electrically connected to the inside of the black box 1 are provided near the boundary between the black box 1 and the macros or the like 2, and wirings 5 which are connected to the respective external connection terminals 4 are extended inside of the macros and or like 2. The shield wirings 3 are broken off at the external connection terminals 4 which are not power supply terminals, and are electrically connected to a power supply terminal, not shown, or a power supply wiring connected to the power supply terminal.

In the example shown in FIG. 4, regarding one of the four sides of the black box 1, it is assumed that there is no need to consider the influence of crosstalk between the macros or the like 2 and the black box 1 and the capacitances produced between the wirings. Therefore, no shield wirings are provided on this side. Needless to say, the shield wirings may be provided in a portion for which it is unnecessary to consider the influence of crosstalk between the macros or the like 2 and the black box 1 and the capacitances produced between the wirings.

In a semiconductor chip with a multilayer wiring structure, wiring layers which have shield wiring structures as shown in FIGS. 1 to 4 are laminated as shown in FIG. 5. The shield wiring 3 is directly connected to the power supply terminal 7 of the macros or the like 2 or a wiring which is connected to the power supply terminal 7. Alternatively, the shield wiring 3 is electrically connected to the power supply terminal 7 on the other wiring layer through a contact section 8 or a wiring which is connected to the power supply terminal 7.

As a result, the potential of the shield wiring 3 which is isolated by, for example, signal terminals 9 of the macros or the like 2 or the potential of the shield wiring 3 which is isolated because it is considered unnecessary, is fixed. In FIG. 5, no shield wiring is provided on a part of a first wiring layer since it is considered unnecessary. In addition, reference symbol 10 in FIG. 5 denotes a semiconductor substrate.

Figure 6:
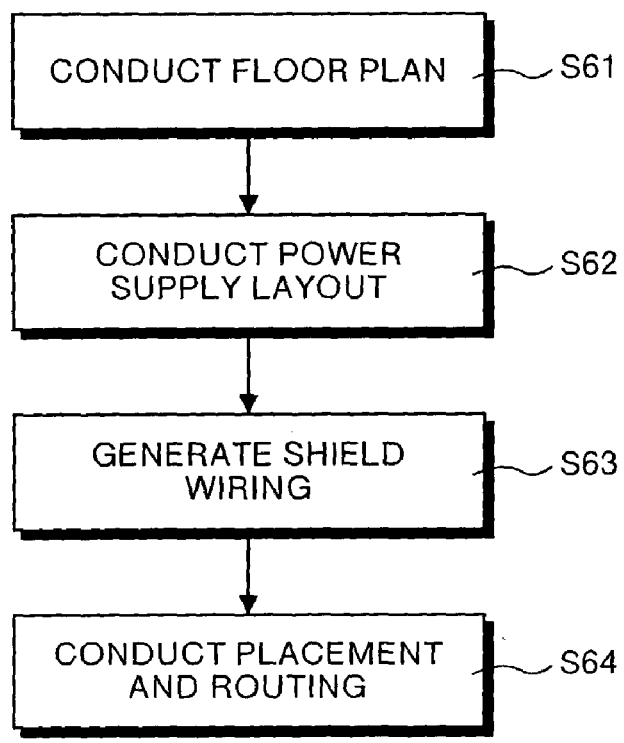
FIG. 6 is a flow chart showing procedures for layout design processing required for designing the shield structure for a semiconductor integrated circuit according to the present invention.

FIG. 6 is a flow chart showing procedures of a layout design processing. In the layout design processing, floor plan is conducted by macro HLB layout or the like (step S61), and the layout of power supply wirings is conducted (step S62). A shield wiring is then formed (step S63), and placement and routing are conducted (step S64).

Figure 7:
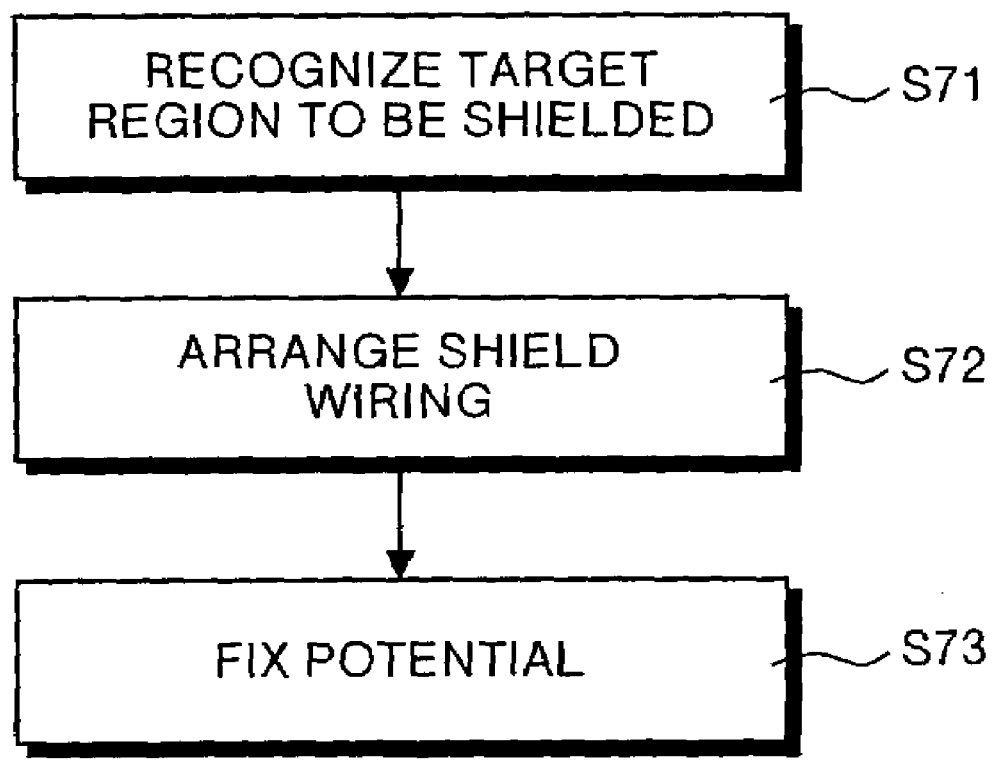
FIG. 7 is a flow chart showing procedures for shield wiring formation processing when designing the shield structure for a semiconductor integrated circuit according to the present invention.

FIG. 7 is a flow chart showing procedures of automatically conducting formation processing for a shield wiring. In the shield wiring formation processing, a region in which the shield wiring is formed is recognized first (step S71). The shield wiring is arranged in the recognized target region to be shielded while avoiding signal terminals or the like as explained above (step S72) The shield wiring thus arranged is connected to a power supply wiring or a power supply terminal on the same wiring layer as the shield wiring, or connected to a power supply wiring or a power supply terminal on a different wiring layer through a contact section, thereby fixing the potential of the shield wiring (step S73).

According to this embodiment, even if there exists the black box 1, it is possible to accurately estimate the influence of crosstalk and the capacitances produced between wirings with respect to the remarked wirings by estimating the influence of crosstalk and the capacitances produced between the wirings in a region in which the physical wiring pattern is clear and the shield wiring 3. Therefore, there is no need to estimate the influence of crosstalk received from the wirings in the black box 1 and the capacitances produced between the wirings. In addition, when no shield wiring is provided in a region in which the physical wiring pattern is clear, it is possible to accurately estimate the influence of crosstalk and the capacitances produced between the wirings in the same manner as explained above, by assuming that the shield wiring is provided in the black box 1.

It is noted here that the conventional shield structure is one which is intended to prevent the mutual influence between a specific wiring and the other wiring on the same wiring layer, or one which is intended to prevent the mutual influence between many and unspecified wirings on an uppermost layer used for macros and wirings on a layer above the uppermost layer. Each of the shield structures in the embodiment is, by contrast, one which is intended to prevent many and unspecified wirings from being influenced by a wiring on the same wiring layer in the black box 1.

The respective shield structures in the embodiment are given as examples, and therefore the present invention is not limited at all by these structures but may be appropriately changed.

According to the present invention, even if there exists a black box in which the physical wiring pattern is unclear, it is possible to accurately estimate the influence of crosstalk and the capacitances produced between wirings with respect to remarked wirings by estimating the influence of crosstalk and the capacitances produced between the wirings in a region in which the physical wiring pattern is clear and the shield wiring. Therefore, there is no need to estimate the influence of crosstalk undergone from the wirings in the black box and the capacitances produced between the wirings. It is, therefore, possible to accurately obtain a delay value.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
   a plurality of regions with a wiring pattern provided in a wiring layer above a semiconductor substrate;
   a target region to be shielded provided in the wiring layer;
   an external connection terminal provided near a boundary of the target region, and for transmitting and receiving a signal between the target region and other regions than the target region; and
   a shield wiring which is arranged on an entire boundary of the target region while avoiding the external connection terminal or a wiring which is electrically connected to the external connection terminal from the other region,
   wherein the shield wiring is electrically connected through a contact section to a terminal of the target region to be shielded, which terminal is provided on a layer different from a layer on which the shield wiring is provided and to which terminal a fixed potential is applied, or to a wiring connected to the terminal of the target region to be shielded; and
   wherein the shield wiring is free of openings from conductive elements contacting the target region; and
   said shield wiring having a laminated structure and being comprised of a plurality of wiring layers with an insulating layer between each of the wiring layers and contact sections connecting the wiring layers to each other.

2. The semiconductor integrated circuit according to claim 1, wherein the shield wiring is connected to a power supply terminal or a power supply wiring of the target region to be shielded.

3. The semiconductor integrated circuit according to claim 1, wherein the target region is covered with a shield layer which is provided on a wiring layer above the target region.

4. The semiconductor integrated circuit according to claim 1, wherein the target region is a macro which is a functional block or a hierarchical block which is provided by hierarchical layout.

5. The semiconductor integrated circuit according to claim 3, wherein the shield layer includes a plurality of strip-like shield wirings.

6. The semiconductor integrated circuit according to claim 1, wherein at least one of said plurality of wiring layers is directly connected to a power supply terminal.

* * * * *